United States Patent
Liu et al.

(10) Patent No.: US 9,142,523 B2
(45) Date of Patent: Sep. 22, 2015

(54) SEMICONDUCTOR DEVICE AND MANUFACTURING METHOD THEREOF

(71) Applicant: TAIWAN SEMICONDUCTOR MANUFACTURING COMPANY LTD., Hsinchu (TW)

(72) Inventors: Yu-Chih Liu, Taipei (TW); Chun-Cheng Lin, Taipei (TW); Wei-Ting Lin, Taipei (TW); Kuan-Lin Ho, Hsinchu (TW); Chin-Liang Chen, Kaohsiung (TW); Shih-Yen Lin, New Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 54 days.

(21) Appl. No.: 14/087,318

(22) Filed: Nov. 22, 2013

(65) Prior Publication Data

US 2015/0145115 A1    May 28, 2015

(51) Int. Cl.

| H01L 23/10 | (2006.01) |
|---|---|
| H01L 23/28 | (2006.01) |
| H01L 21/50 | (2006.01) |
| H01L 21/48 | (2006.01) |
| H01L 23/00 | (2006.01) |
| H01L 21/56 | (2006.01) |
| H01L 23/31 | (2006.01) |
| H01L 23/29 | (2006.01) |
| H01L 23/367 | (2006.01) |

(52) U.S. Cl.
CPC .............. *H01L 24/17* (2013.01); *H01L 21/565* (2013.01); *H01L 23/293* (2013.01); *H01L 23/3107* (2013.01); *H01L 23/367* (2013.01); *H01L 24/81* (2013.01); *H01L 2224/16113* (2013.01); *H01L 2224/16227* (2013.01)

(58) Field of Classification Search
CPC ....... H01L 24/17; H01L 14/81; H01L 21/565; H01L 2224/16227
USPC .......................... 257/707, 796; 438/122, 124
See application file for complete search history.

(56) References Cited

U.S. PATENT DOCUMENTS

| 5,883,430 | A | * | 3/1999 | Johnson | 257/706 |
|---|---|---|---|---|---|
| 5,909,056 | A | * | 6/1999 | Mertol | 257/704 |
| 6,507,116 | B1 | * | 1/2003 | Caletka et al. | 257/778 |
| 7,074,645 | B2 | * | 7/2006 | Huang et al. | 438/106 |
| 7,906,857 | B1 | * | 3/2011 | Hoang et al. | 257/783 |
| 8,338,943 | B2 | * | 12/2012 | Loo | 257/707 |
| 2013/0049188 | A1 | * | 2/2013 | Choi et al. | 257/717 |

* cited by examiner

Primary Examiner — Luan C Thai
(74) Attorney, Agent, or Firm — Chun-Ming Shih

(57) ABSTRACT

A semiconductor device includes a carrier, a die including a first surface and a second surface, a plurality of first conductive bumps disposed between the second surface of the carrier and the die, wherein the die is flip bonded on the carrier, and a molding disposed over the carrier and surrounding the die, wherein the molding includes a recessed portion disposed on the first surface of the die thereby leaving a portion of the first surface is uncovered by the molding. Further, a method of manufacturing a semiconductor device includes providing a carrier, flip bonding a die on the carrier, disposing a rubber material on a first surface of the die and within the first surface of the die, and forming a molding surrounding the rubber material and covering the carrier.

20 Claims, 13 Drawing Sheets

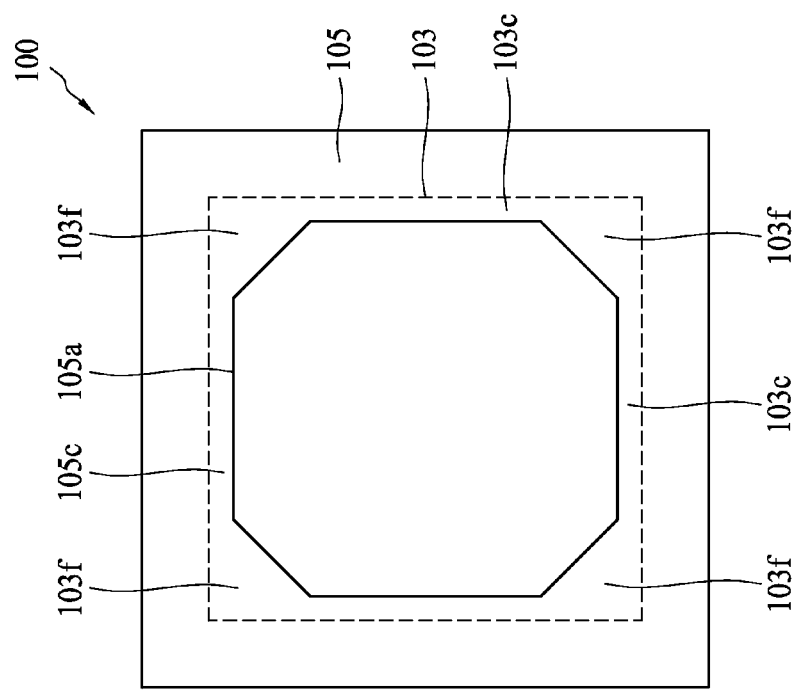
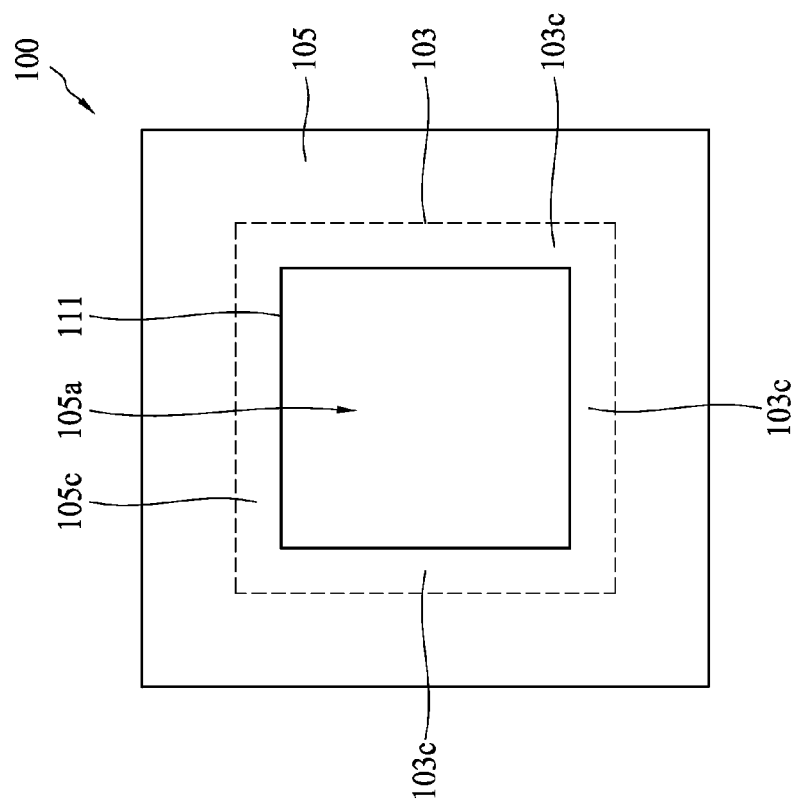

SEMICONDUCTOR DEVICE AND MANUFACTURING METHOD THEREOF

FIELD

The disclosure relates to a semiconductor device and a method of manufacturing a semiconductor device.

BACKGROUND

Electronic equipments involving semiconductor devices are indispensable from our daily life. With the advancement of electronic technology, electronic equipments become more complicated and involve greater amount of integrated circuitry for executing the desired multi-functionality. Thus, manufacturing of the electronic equipment includes more and more operations as well as various kinds of materials in order to produce the semiconductor devices in the electronic equipments. Therefore, there is a continuous demand on simplifying the steps of production, increasing a production efficiency and lowering an associated manufacturing cost on each electronic equipment.

During the operations of manufacturing the semiconductor device, the semiconductor device is assembled with numbers of integrated components including various materials with difference in thermal properties. As such, the integrated components are in undesired configurations after curing of the semiconductor device. The undesired configurations would lead to yield loss of the semiconductor device, poor bondability between the components, development of cracks, delamination of the components or etc. Furthermore, the components of the semiconductor device includes various metallic materials which are in limited quantity and thus in a high cost. The undesired configurations of the components and the yield loss of the semiconductor would further exacerbate materials wastage and thus the manufacturing cost would increase.

As more different components with different materials are involved and a complexity of the manufacturing operations of the semiconductor device is increased, there are more challenges to modify a structure of the semiconductor device and improve the manufacturing operations. As such, there is a continuous need to improve the method for manufacturing the semiconductor and solve the above deficiencies.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 1A is a top view of a semiconductor device with a recessed portion in a rectangular shape in accordance with some embodiments of the present disclosure.

FIG. 1B is a top view of a semiconductor device with a recessed portion in a polygonal shape in accordance with some embodiments of the present disclosure.

DETAILED DESCRIPTION OF THE INVENTION

Figure 1:
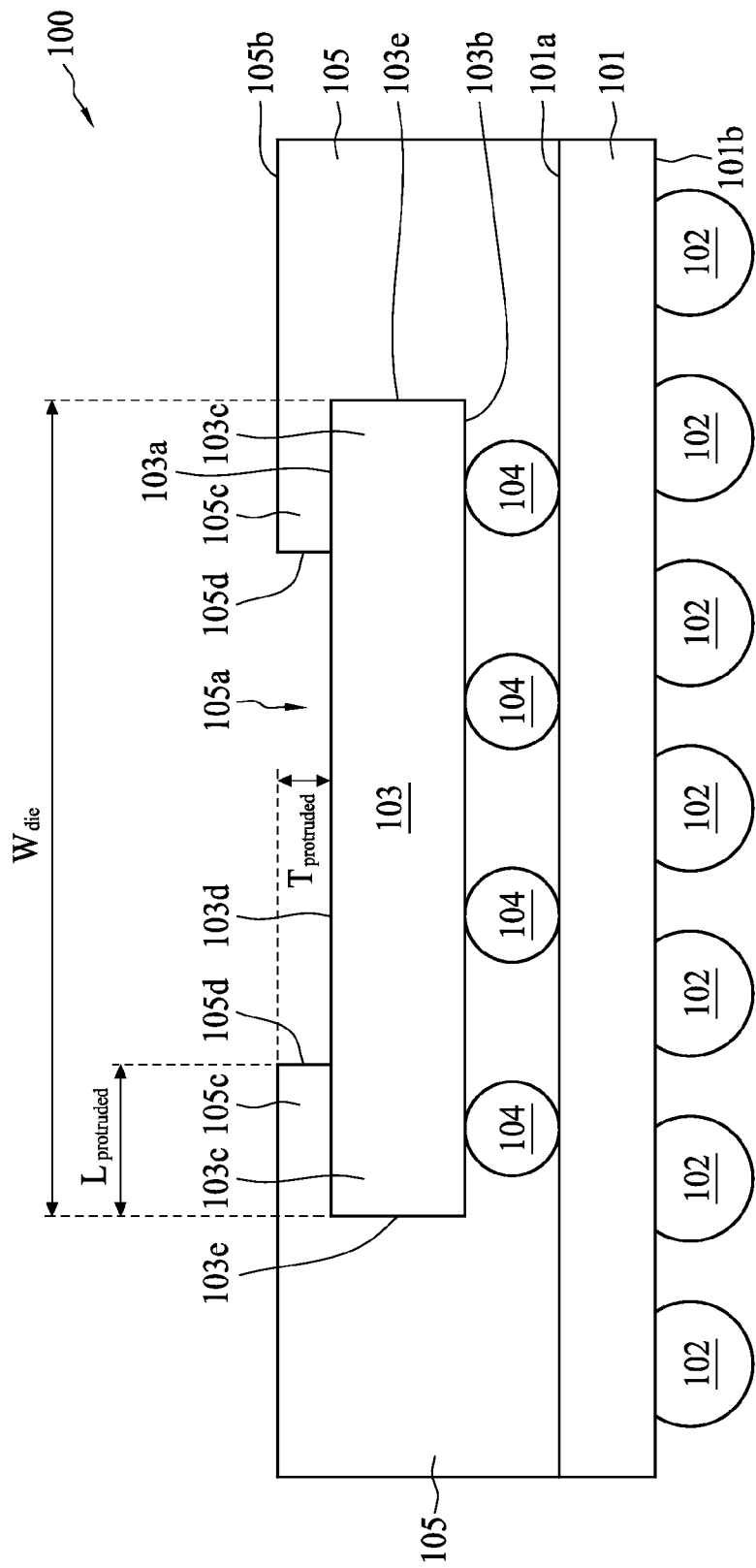
FIG. 1 is a schematic view of a semiconductor device in accordance with some embodiments of the present disclosure.

A semiconductor device is manufactured by a number of operations. During the manufacturing, a die is attached on a carrier or a substrate by several die bumps, and those die bumps are then encapsulated by a molding underfill (MUF) or molding compounds. The MUF covers the carrier and surrounds the die in order to protect electrical connections of the die bumps between the die and the carrier. Based on such structural configuration, the die is interfaced with various kinds of materials with different thermal properties such as the MUF, the bumps, the carrier and etc. These materials have different coefficient of thermal expansion (CTE). Such a mismatch of CTE would cause a stress developed at a corner of the die and thus develop cracks within the semiconductor device and chippings peeled out from an edge of the die.

Furthermore, the cracks can even propagate from the corner of the die to an interior of the semiconductor device during subsequent manufacturing operations. The propagation of the cracks further weakens the electrical connections between the die and the carrier and leads to a delamination of components from the semiconductor device after thousands of thermal cycles, and ultimately result in a failure of the semiconductor device.

In the present disclosure, a semiconductor device with a structural improvement is disclosed. The semiconductor device includes a carrier, a die and a molding. The die disposed on the carrier has a first surface and a second surface disposed with several first conductive bumps or die bumps. The molding has a height higher than the die, so that a portion of the molding is disposed on a periphery portion of the first surface of the die, and thus the die interfacing with other materials is minimized and a development of cracks within the semiconductor device is prevented. Furthermore, the molding with higher height can facilitate a control of a bond line thickness (BLT) of the semiconductor device which is a distance between the first surface of the die and a heat dissipator, and the protruded portion of the molding optimizes an uniformity of the BLT of the semiconductor device, and thus ultimately improve a reliability of the semiconductor device.

The manufacturing and use of the embodiments of the present invention are discussed in details below. It should be appreciated, however, that the embodiments provide many applicable inventive concepts that can be embodied in a wide variety of specific contexts. It is to be understood that the following disclosure provides many different embodiments or examples for implementing different features of various embodiments. Specific examples of components and arrangements are described below to simplify the present disclosure. These are, of course, merely examples and are not intended to be limiting.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Further, it is understood that several processing steps and/or features of a device may be only briefly described. Also, additional processing steps and/or features can be added, and certain of the following processing steps and/or features can be removed or changed while still implementing the claims. Thus, the following description should be understood to represent examples only, and are not intended to suggest that one or more steps or features is required.

In addition, the present disclosure may repeat reference numerals and/or letters in the various examples. This repetition is for the purpose of simplicity and clarity and does not in itself dictate a relationship between the various embodiments and/or configurations discussed.

FIG. 1 is an embodiment of a semiconductor device 100. The semiconductor device 100 includes a carrier 101. In some embodiments, the carrier 101 is a substrate or wafer which would be fabricated to become integrated circuits (IC) in subsequent manufacturing operations. In some embodiments, the carrier 101 is a circuit board including some circuits for electrical connection of components thereon. In some embodiments, the circuit board is a printed circuit board (PCB). In some embodiments, the carrier 101 includes silicon, ceramic, copper or etc. In some embodiments, the carrier 101 is in a circular shape.

In some embodiments, the carrier 101 includes a surface 101a and another surface 101b opposite to the surface 101a. In some embodiments, the surface 101a of the carrier 101 is configured for electrically connecting with a circuitry external to the carrier 101. In some embodiments, the surface 101a includes several bond pads to facilitate the electrical connection with the circuitry external to the carrier 101. In some embodiments, the bond pads are solderable surfaces and include metals such as copper.

In some embodiments, another surface 101b of the carrier 101 is disposed with several conductive bumps 102. In some embodiments, the conductive bumps 102 are configured for receiving other pads on another carrier and electrically connecting with a circuitry external to the carrier 101. In some embodiments, the conductive bumps 102 are intervally spaced with each other on another surface 101b. In some embodiments, each conductive bump 102 is a solder bump, solder ball, solder paste or etc. In some embodiments, each of the conductive bumps 102 is in a spherical shape.

In some embodiments, the semiconductor device 100 includes a die 103. In some embodiments, the die 103 is a piece including semiconductor materials such as silicon, and is fabricated with a predetermined functional circuit within the die 103 produced by photolithography operations. In some embodiments, the die 103 is singulated from a silicon wafer by a mechanical or laser blade and then is placed on the carrier 101 for subsequent manufacturing operations. In some embodiments, the die 103 is attached on the surface 101a of the carrier 101 by a flux, an adhesive or etc. In some embodiments, the die 103 is in a quadrilateral, a rectangular or a square shape. In some embodiments, the die 103 has a width $W_{die}$ of about 5 mm to about 35 mm.

In some embodiments, the die 103 includes a first surface 103a and a second surface 103b. In some embodiments, the die 103 is disposed on the surface 101a of the carrier 101, so as to electrically connect a circuitry of the die 103 with the circuitry of the carrier 101. The second surface 103b of the die 103 and the surface 101a of the carrier 101 are electrically connected.

In some embodiments, the die 103 is flip bonded on the carrier 101, that the second surface 103b is an active surface of the die 103 including several contacts electrically connected with several conductive traces or several circuits within the die, while the first surface 103a is an inactive surface of the die 103 without any contacts and opposite to the active surface. In some embodiments, the die 103 is disposed parallel to the carrier 101. In some embodiments, the second surface 103b of the die 103 is substantially parallel to the surface 101a of the carrier 101.

In some embodiments, several first conductive bumps 104 are disposed between the second surface 103b of the die 103 and the carrier 101. In some embodiments, the first conductive bumps 104 are die bumps. In some embodiments, the first conductive bumps 104 are intervally spaced from each other on the second surface 103b. In some embodiments, the second surface 103b of the die 103 is electrically connected with the surface 101a of the carrier 101 by the first conductive bumps 104. In some embodiments, the first conductive bumps 104 are conductive bumps for electrically connecting at least two circuitries respectively on different carriers.

In some embodiments, the first conductive bumps 104 bond several die pads on the second surface 103b of the die 103 with several bond pads on the surface 101a of the carrier, so that the circuitry of the die 103 is electrically connected with the circuitry of the carrier 101. In some embodiments, each first conductive bump 104 is a solder bump, solder ball, solder paste or etc. In some embodiments, each of the first conductive bumps 104 is in a spherical shape.

In some embodiments, a molding 105 is disposed over the carrier 101 and surrounds the die 103. In some embodiments, the molding 105 is disposed on the surface 101a of the carrier 101 and a periphery portion 103c of the first surface 103a of the die 103. The periphery portion 103c of the first surface 103a is proximal to a sidewall 103e of the die 103 and is adjacent to a perimeter or boundary of the first surface 103a. The molding 105 also fills several gaps between the first conductive bumps 104 for surrounding and protecting the first conductive bumps 104. In some embodiments, the first surface 103a of the die 103 is at a level substantially lower than a top surface 105b of the molding 105, so that the molding 105 interfaced with the first surface 103a of the die 103 is in a staggered configuration.

In some embodiments, the molding 105 is a molding compound including epoxy resins, phenolic hardeners, silicas, catalysts, pigments, mold release agents, and the like. The molding 105 has a high thermal conductivity, a low moisture absorption rate, a high flexural strength at board-mounting temperatures, or a combination of these.

In some embodiments, the molding 105 includes a recessed portion 105a disposed on the first surface 103a of the die 103. In some embodiments, the recessed portion 105a leaves a central portion 103d of the die 103 uncovered by the molding 105. In some embodiments, the recessed portion 105a is extended from the top surface 105b of the molding to the central portion 103d of the first surface 103a of the die 103 along the first surface 103a, so that the central portion 103d of the first surface 103a of the die 103 is exposed without any coverage. In some embodiments, the recessed portion 105a is disposed within the first surface 103a. In some embodiments, a sidewall 105d of the recessed portion 105a is distal to the sidewall 103e of the die 103.

In some embodiments, an interface 111 between the recessed portion 105a and the first surface 103a of the die 103 is in various shapes such as a rectangular, quadrilateral or polygonal shape. FIGS. 1A and 1B are respectively a top view of the semiconductor device 100. In some embodiments as in FIG. 1A, the interface 111 between the recessed portion 105a and the first surface 103a of the die 103 is in a rectangular shape. The recessed portion 105a and the die 103 are concentrically disposed with each other. The interface 111 between the recessed portion 105a and the first surface 103a of the die 103 is a subset of the first surface 103a of the die 103. The interface 111 between the recessed portion 105a and the first surface 103a of the die 103 is circumscribed by the first surface 103a of the die 103.

In some embodiments as in FIG. 1B, the interface 111 between the recessed portion 105a and the first surface 103a of the die 103 is in a octagonal shape, which is different from the first surface 103a of the die 103 in a rectangular shape. The interface 111 between the recessed portion 105a and the first surface 103a of the die 103 is circumscribed by the first surface 103a of the die 103.

In some embodiments, the molding 105 includes a protruded portion 105c disposed on the periphery portion 103c of the first surface 103a. In some embodiments, the protruded portion 105c is protruded from the sidewall 103e of the die 103 along the first surface 103a. In some embodiments, an interface between the protruded portion 105c of the molding 105 and the first surface 103a of the die 103 is in a rectangular, quadrilateral or polygonal shape.

In some embodiments, as in FIG. 1A, the protruded portion 105c is disposed at an edge of the die 103. The protruded portion 105c is disposed at four sides of the die 103 to cover four edges of the die 103.

In some embodiments as in FIG. 1B, the protruded portion 105c is disposed at a corner 103f of the die 103. The protruded portion 105c is disposed at four corners of the die 103, so that the four sides and the four corners of the die 103 are covered by the protruded portion 105c of the molding 105. As the corner of the die 103 is covered by the molding 105, the molding 105 protects the die 103 from direct collision during shipping of the semiconductor device 100, and thus a reliability of the semiconductor device 100 is improved.

Referring back to FIG. 1, in some embodiments, the protruded portion 105c has a length $L_{protruded}$ protruded from the sidewall 103e of the die 103. In some embodiments, the length $L_{protruded}$ is about 0.3 mm to about 2 mm. In some embodiments, the protruded portion 105c has a thickness $T_{protruded}$ extending from the top surface 105b of the molding 105 to the first surface 103a of the die 103. In some embodiments, the thickness $T_{protruded}$ of the protruded portion 105c is about 0.05 mm to about 0.3 mm.

Figure 2:
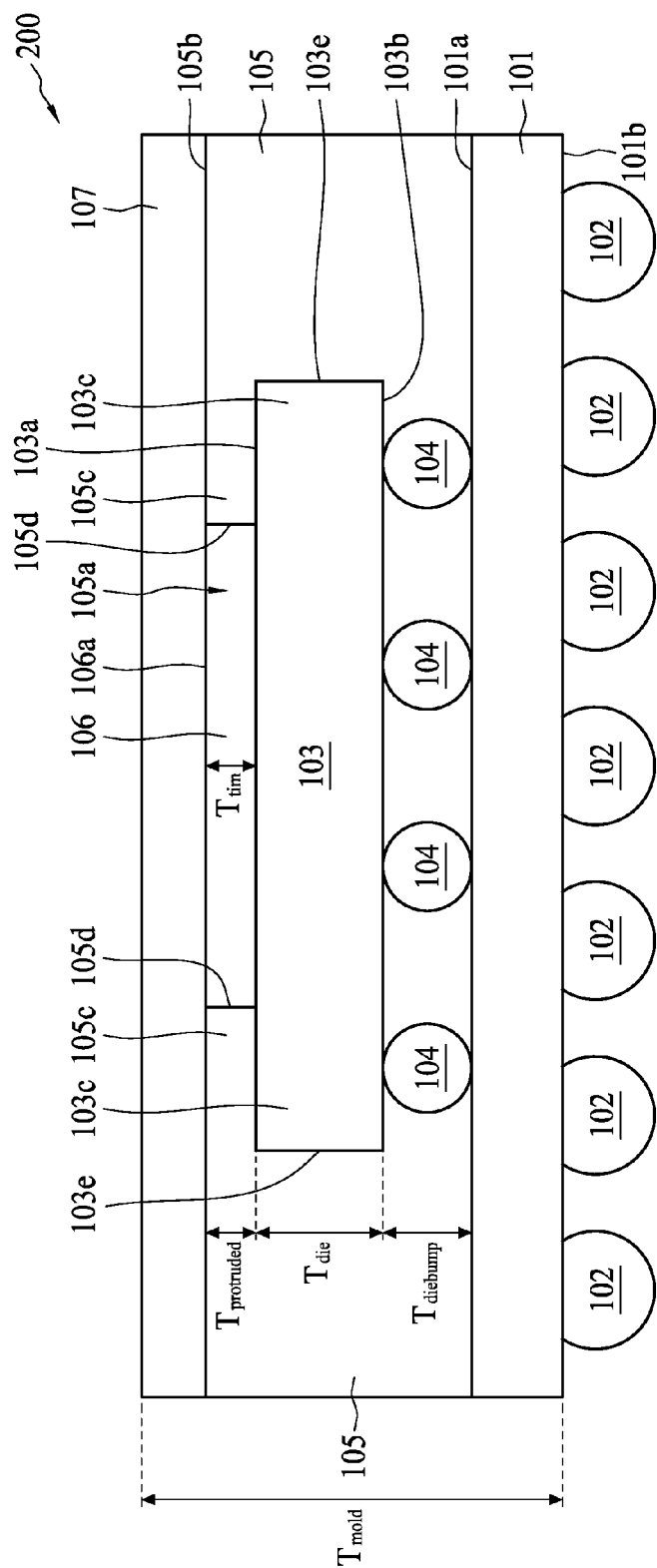
FIG. 2 is a schematic view of a semiconductor package in accordance with some embodiments of the present disclosure.

FIG. 2 is an embodiment of a semiconductor package 200. In some embodiments, the semiconductor package 200 includes various semiconductor components assembled in a package. There are various kinds of packages such as quad flat package (QFP), chip scale package (CSP), ball grid array (BGA) package or etc. In some embodiments, the semiconductor package 200 is a flip chip ball grid array (FCBGA) package which includes a flip chip disposed on a carrier or a substrate.

In some embodiments, the semiconductor package 200 includes a carrier 101. In some embodiments, the carrier 101 is a substrate or wafer which would be fabricated to become integrated circuits (IC) in subsequent manufacturing operations. In some embodiments, the circuit board is a printed circuit board (PCB). In some embodiments, the carrier 101 includes silicon, ceramic, copper or etc.

In some embodiments, the carrier 101 includes a surface 101a and another surface 101b opposite to the surface 101a and disposed with several conductive bumps 102. The conductive bumps 102 are for receiving other pads on another carrier and electrically connecting with a circuitry external to the carrier 101. In some embodiments, the conductive bumps 102 are intervally spaced with each other on another surface 101b, and are arranged in an array or matrix to become a ball grid array (BGA) package. In some embodiments, each conductive bump 102 is a solder bump, solder ball, solder paste or etc. In some embodiments, each of the conductive bumps 102 is in a spherical shape.

In some embodiments, the semiconductor package 200 includes a die 103. In some embodiments, the die 103 is a piece including semiconductor materials such as silicon, and is fabricated with a predetermined functional circuit within the die 103 produced by photolithography operations. In some embodiments, the die 103 is attached on the surface 101a of the carrier 101 by a flux, an adhesive or etc. In some embodiments, the die 103 is a flip chip which is flip bonded on the carrier 101 by several first conductive bumps 104 or flip chip bumps. In some embodiments, the die 103 is in a quadrilateral, a rectangular or a square shape.

In some embodiments, the die 103 includes a first surface 103a and a second surface 103b. In some embodiments, the second surface 103b of the die 103 is electrically connected with the surface 101a of the carrier 101 by the first conductive bumps 104. In some embodiments, the die 103 is flip bonded on the carrier 101, that the second surface 103b is an active surface of the die 103 including several contacts electrically connected with several conductive traces or several circuits within the die, while the first surface 103a is an inactive surface of the die 103 without any contacts and opposite to the active surface. In some embodiments, the second surface 103b of the die 103 is substantially parallel to the surface 101a of the carrier 101.

In some embodiments, the first conductive bumps 104 are die bumps. The first conductive bumps 104 are disposed between the second surface 103b of the die 103 and the surface 101a of the carrier 101. In some embodiments, the first conductive bumps 104 are intervally spaced from each other on the second surface 103b. In some embodiments, the second surface 103b of the die 103 is electrically connected with the surface 101a of the carrier 101 by the first conductive bumps 104.

In some embodiments, the semiconductor package 200 includes a molding 105. The molding 105 is disposed over the carrier 101 and surrounds the die 103. In some embodiments, the molding 105 is disposed on the surface 101a of the carrier 101 and a periphery portion 103c of the first surface 103a of the die 103. The periphery portion 103c of the first surface 103a is proximal to a sidewall 103e of the die 103 and is adjacent to a perimeter or boundary of the first surface 103a. In some embodiments, the molding 105 also surrounds the first conductive bumps 104.

In some embodiments, the first surface 103a of the die 103 is at a level substantially lower than a top surface 105b of the molding 105, so that the molding 105 interfaced with the first surface 103a of the die 103 is in a staggered configuration. In some embodiments, the molding 105 is a molding compound including a liquid epoxy which is able to flow and fill a space between the die 103 and the carrier 101. The molding is able to be cured by a heat treatment such as reflow.

In some embodiments, the molding 105 includes a recessed portion 105a disposed on the first surface 103a of the die 103. In some embodiments, the recessed portion 105a leaves a central portion 103d of the die 103 uncovered by the molding 105. In some embodiments, the recessed portion 105a is disposed within the first surface 103a.

In some embodiments, a sidewall 105d of the recessed portion 105a is distal to a sidewall 103e of the die 103. In some embodiments, an interface between the recessed portion 105a and the first surface 103a of the die 103 is in various shapes such as a rectangular, quadrilateral or polygonal shape.

In some embodiments, the molding 105 includes a protruded portion 105c disposed on the periphery portion 103c of the first surface 103a. In some embodiments, the protruded portion 105c is protruded from the sidewall 103e of the die 103 along the first surface 103a. In some embodiments, an interface between the protruded portion 105c of the molding 105 and the first surface 103a of the die 103 is in a rectangular, quadrilateral or polygonal shape.

In some embodiments, the semiconductor package 200 includes a thermal interface material (TIM) 106. The TIM 106 is disposed on the first surface 103a of the die 103 and is surrounded by the protruded portion 105c of the molding 105. In some embodiments, the TIM 106 is disposed within the recessed portion 105a. The TIM 106 fills the recessed portion 105a of the molding, and is bound by the sidewall 105d of the protruded portion 105c of the molding 105 and the first surface 103a of the die 103. Thus, the TIM 106 would not flow out from the recessed portion 105a when the semiconductor package 200 is under a high temperature or thermal cycling.

In some embodiments, the TIM 106 is disposed at a central portion 103d of the die 103, so as to facilitate a thermal dissipation of the semiconductor package 200. In some embodiments, the TIM 106 includes tin, gallium, indium or etc.

In some embodiments, the TIM 106 has a top surface 106a at a level substantially same as the top surface 105b of the molding 105. In some embodiments, a thickness $T_{protruded}$ of the protruded portion 105c of the molding 105 is substantially equal to a thickness $T_{tim}$ of the TIM 106. In some embodiments, a total of the thickness $T_{tim}$ of the TIM 106, a thickness $T_{die}$ of the die 103 and a height $T_{die\ bump}$ of the first conductive bumps 104 is substantially equal to a height $T_{mold}$ of the molding 105.

In some embodiments, the semiconductor package 200 has a bond line thickness (BLT) which is a distance between the first surface 103a of the die 103 and the top surface 105b of the molding 105. In some embodiments, the BLT of the semiconductor package 200 is substantially equal to the thickness $T_{protruded}$ of the protruded portion 105c of the molding 105. In some embodiments, the BLT of the semiconductor package 200 is substantially equal to the thickness $T_{tim}$ of the TIM 106.

As the thickness $T_{tim}$ of the TIM 106 disposed on the first surface 103a of the die 103 is dependent on the thickness $T_{protruded}$ of the protruded portion 105c of the molding 105, the BLT is decided by the thickness $T_{protruded}$ of the protruded portion 105c of the molding 105 and thus the BLT is under a well control to be in a fine and thin BLT. The semiconductor package 200 in such structural configuration has a bond line in an uniform thickness and thus an improved reliability of the semiconductor package 200. Furthermore, the semiconductor package 200 with a controlled BLT has lesser stress points adjacent to the corner 103c of the die 103, and thus a development of cracks within the molding 105 is minimized or even prevented.

In some embodiments, a heat dissipator 107 is disposed on the top surface 105b of the molding 105 and the top surface 106a of the TIM 106. The heat dissipator 107 is attached with the TIM 106 and is disposed over the molding 105. In some embodiments, the heat dissipator 107 is a heat sink, heat spreader, thermal adhesive or etc. In some embodiments, the heat dissipator 107 includes metals or conductive materials such as aluminum, copper or etc.

In some embodiments, the heat dissipator 107 is bonded with the TIM 106 and transfers a heat generated by the die 103 or the carrier 101 away from the semiconductor package 200. The heat from the die 103 or the carrier is directed from the die 103 to the surrounding through the TIM 106 and the dissipator.

Based on such structural configuration, the semiconductor package 200 as a whole would not be overheated during operations of the semiconductor package 200, and thus a performance and functionality of the semiconductor package 200 would not be declined after a period of operation time.

In the present disclosure, a method of manufacturing a semiconductor device is also disclosed. In some embodiments, a semiconductor device is formed by a method 300. The method 300 includes a number of operations and the description and illustration are not deemed as a limitation as the sequence of the operations.

Figure 3:
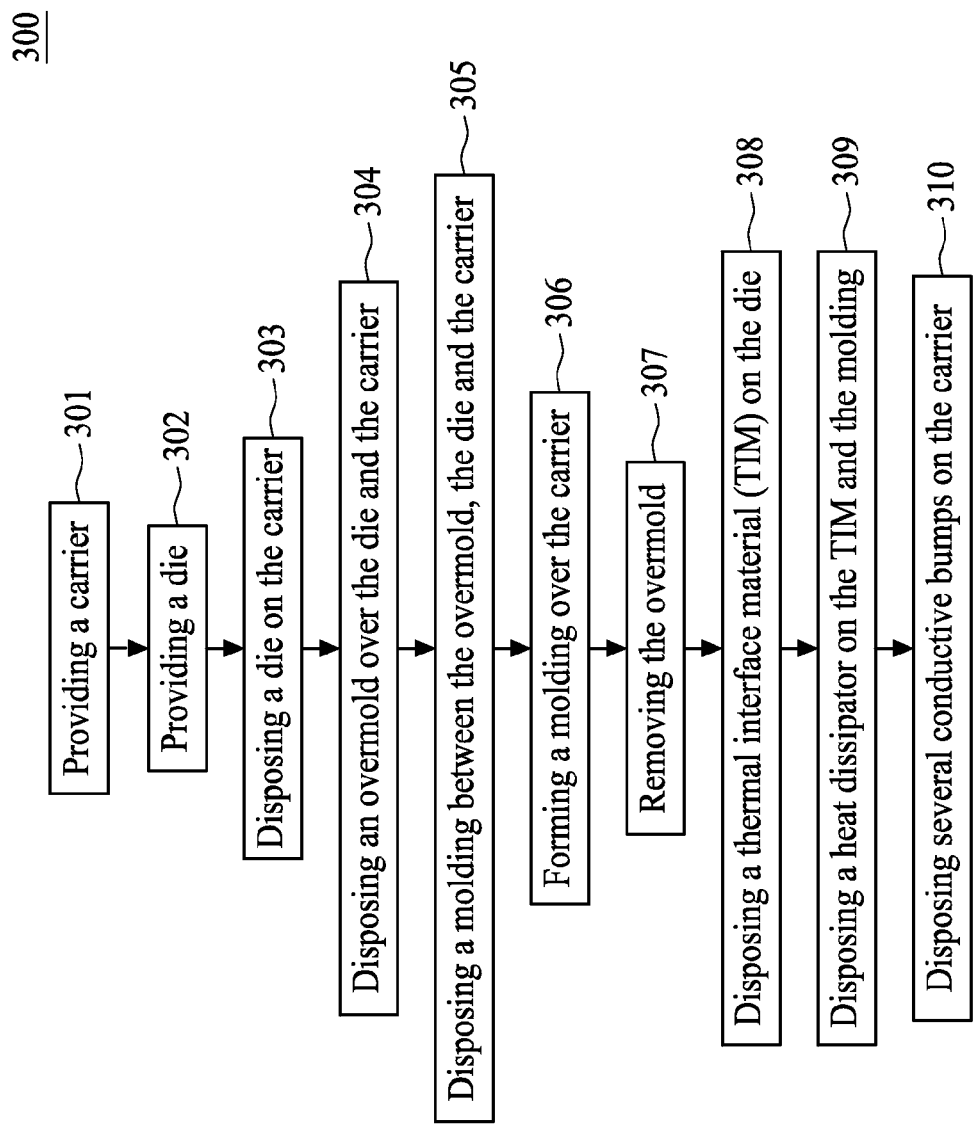
FIG. 3 is a flow diagram of a method of manufacturing a semiconductor device in accordance with some embodiments of the present disclosure.

FIG. 3 is an embodiment of a method 300 of manufacturing a semiconductor device. The method 300 includes a number of operations (301, 302, 303, 304, 305, 306, 307, 308, 309 and 310).

Figure 3A:
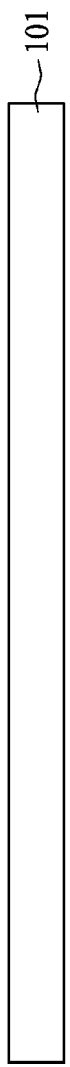
FIG. 3A is a schematic view of a carrier in accordance with some embodiments of the present disclosure.

In operation 301, a carrier 101 is provided as in FIG. 3A. In some embodiments, the carrier 101 is formed by a semiconductor material such as silicon. In some embodiments, the carrier 101 is in a similar configuration as the carrier 101 in FIGS. 1 and 2.

Figure 3B:
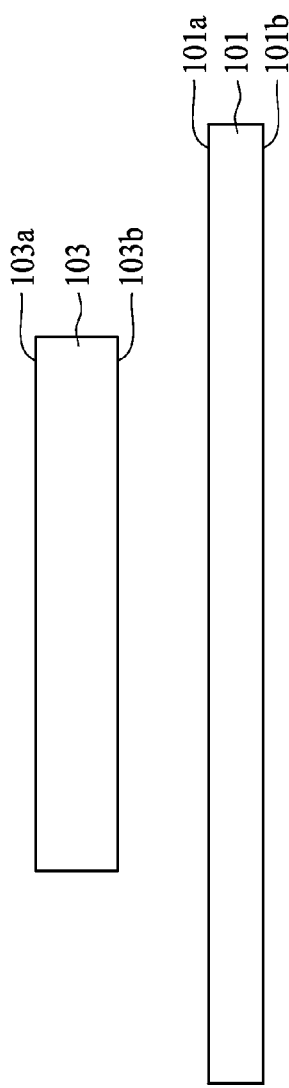
FIG. 3B is a schematic view of a carrier and a die in accordance with some embodiments of the present disclosure.

In operation 302, a die 103 is provided as in FIG. 3B. In some embodiments, the die 103 is a piece including semiconductor material and is fabricated with a given functional circuit. In some embodiments, the die 103 is a flip chip which is flipped over upon bonding on the carrier 101, so that an active surface of the die 103 is faced downward and thus the active surface is a bottom surface 103b of the die 103. In some embodiments, the die 103 is configured and oriented similar to the die 103 as in FIGS. 1 and 2.

Figure 3C:
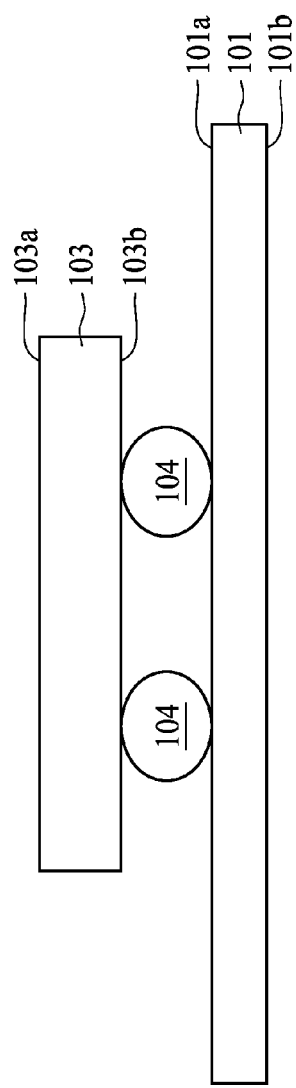
FIG. 3C is a schematic view of a carrier bonded with a die by several first conductive bumps in accordance with some embodiments of the present disclosure.

In operation 303, the die 103 is disposed on the top surface 101a of the carrier 101 as in FIG. 3C. In some embodiments, the die 103 is bonded with the carrier 101 by several die bumps 104 disposed on several die pads on the bottom surface 103b of the die 103; so that a circuitry of the die 103 is electrically connected a circuitry of the carrier 101 through the die bumps 104. In some embodiments, the die bumps 104 are configured as the die bumps 104 as in FIGS. 1 and 2.

Figure 3D:
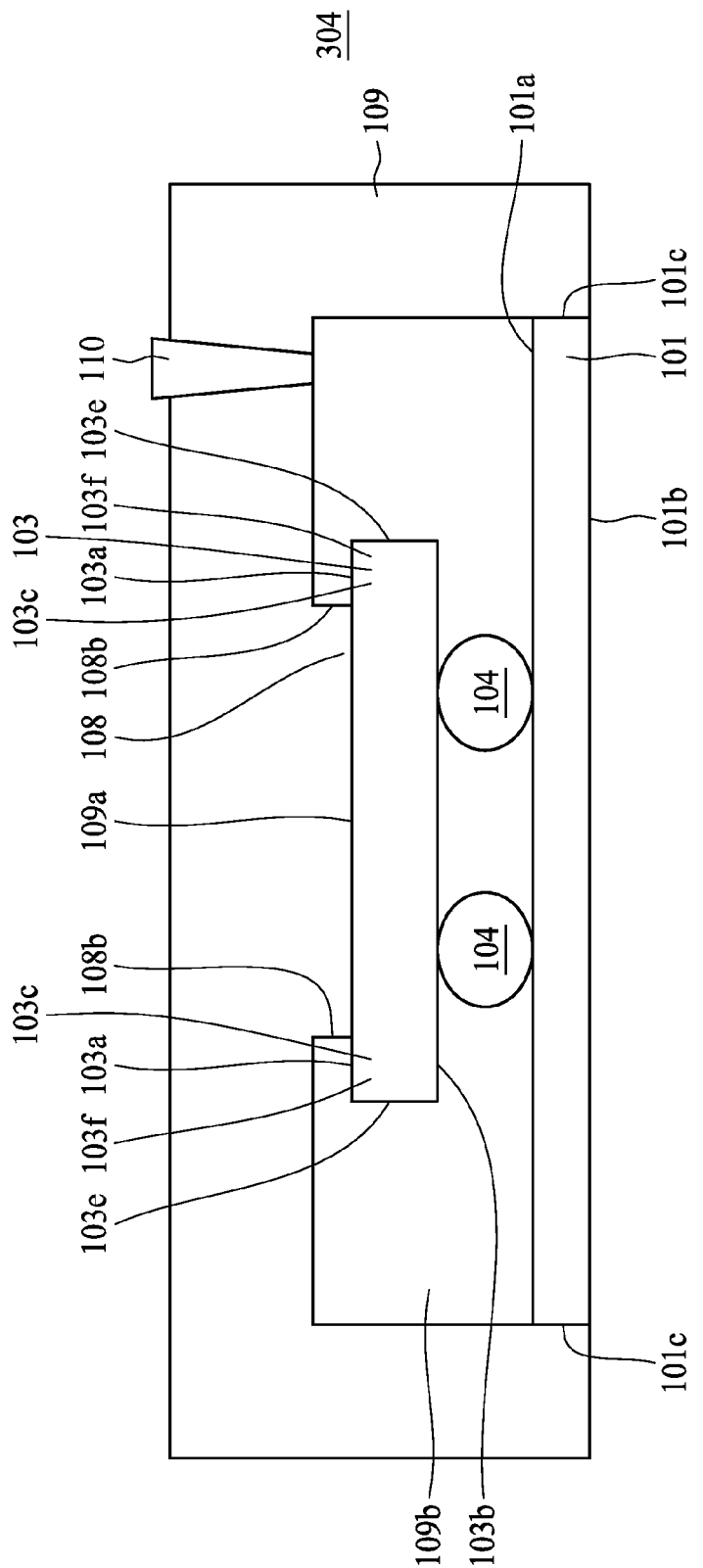
FIG. 3D is a schematic view of an overmold disposed on a die in accordance with some embodiments of the present disclosure.

In operation 304, an overmold 109 is disposed over the die 103 and the carrier 101 as in FIG. 3D. In some embodiments, the overmold 109 includes a rubber material 108 which is temporarily attached on the top surface 103a of the die 103 upon an overmolding operation and formation of a molding. In some embodiments, the rubber material 108 of the overmold 109 is disposed above and within a surface area of the top surface 103a of the die 103. In some embodiments, a sidewall 108b of the rubber material 108 of the overmold 109 is within a sidewall 103e of the die 103. The sidewall 108b is distal to the sidewall 103e.

In some embodiments, an interface between the rubber material 108 of the overmold 109 and the top surface 103a of the die 103 is substantially smaller than the top surface 103a of the die 103. In some embodiments, the rubber material 108 of the overmold 109 is shaped such that the sidewall 108b of the rubber material 108 is distanced away from a periphery portion 103c of the die 103. In some embodiments, the sidewall 108b of the rubber material 108 is distanced away from a corner 103f of the die 103. In some embodiments, the overmold 109 includes a chamber 109b for temporarily encapsulating the die 103 and the die bumps 104. In some embodiments, the interface between the rubber material 108 of the overmold 109 and the top surface 103a of the die 103 is in various shape, such as rectangular, quadrilateral, polygonal or etc.

Figure 3E:
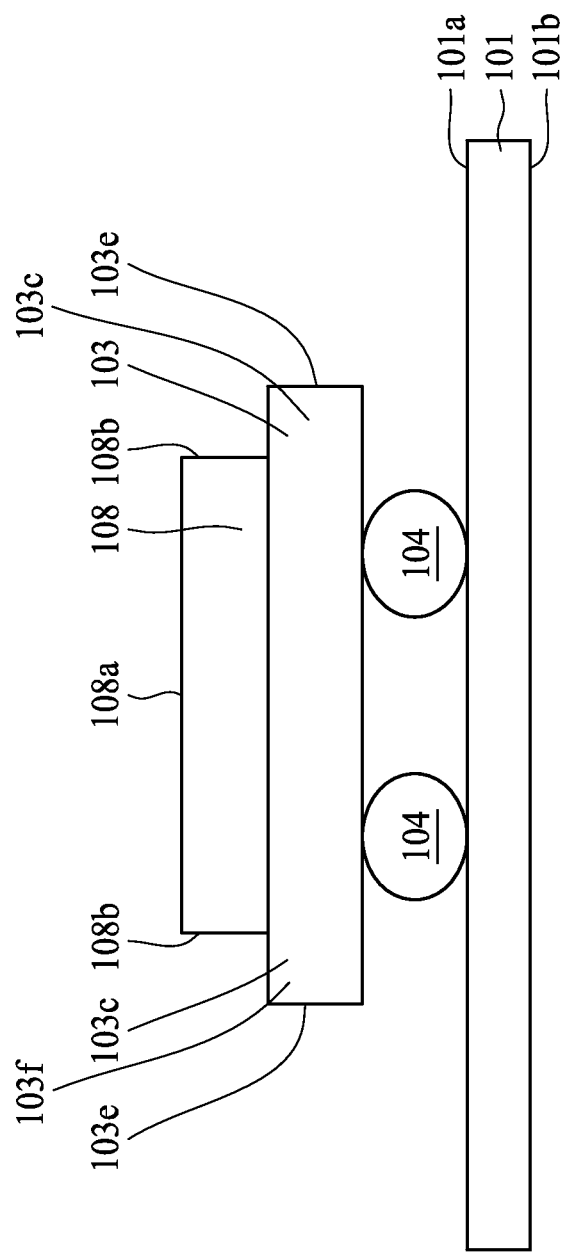
FIG. 3E is a schematic view of a rubber material disposed over a carrier in accordance with some embodiments of the present disclosure.

In some embodiments, the rubber material 108 is not integral with the overmold 109 as in FIG. 3E. The rubber material 108 is not a part of the overmold 109. The rubber material 108 is an individual component and is separated from the overmold 109.

In some embodiments of the operation 304 as in FIG. 3E, the rubber material 108 is first disposed on the top surface 103a of the die 103 and is temporarily attached on the top surface 103a of the die 103 upon the overmolding operation and formation of a molding. In some embodiments, the rubber material 108 is disposed above and within a surface area of the top surface 103a of the die 103. In some embodiments, the sidewall 108b of the rubber material 108 is within the sidewall 103e of the die 103. The sidewall 108b is distal to the sidewall 103e.

In some embodiments, an interface between the rubber material 108 and the top surface 103a of the die 103 is substantially smaller than the top surface 103a of the die 103. In some embodiments, the rubber material 108 is shaped such that the sidewall 108b of the rubber material 108 is distanced away from the periphery portion 103c of the die 103. In some embodiments, the sidewall 108b of the rubber material 108 is distanced away from the corner 103f of the die 103. In some embodiments, the interface between the rubber material 108 and the top surface 103a of the die 103 is in various shape, such as rectangular, quadrilateral, polygonal or etc.

Figure 3F:
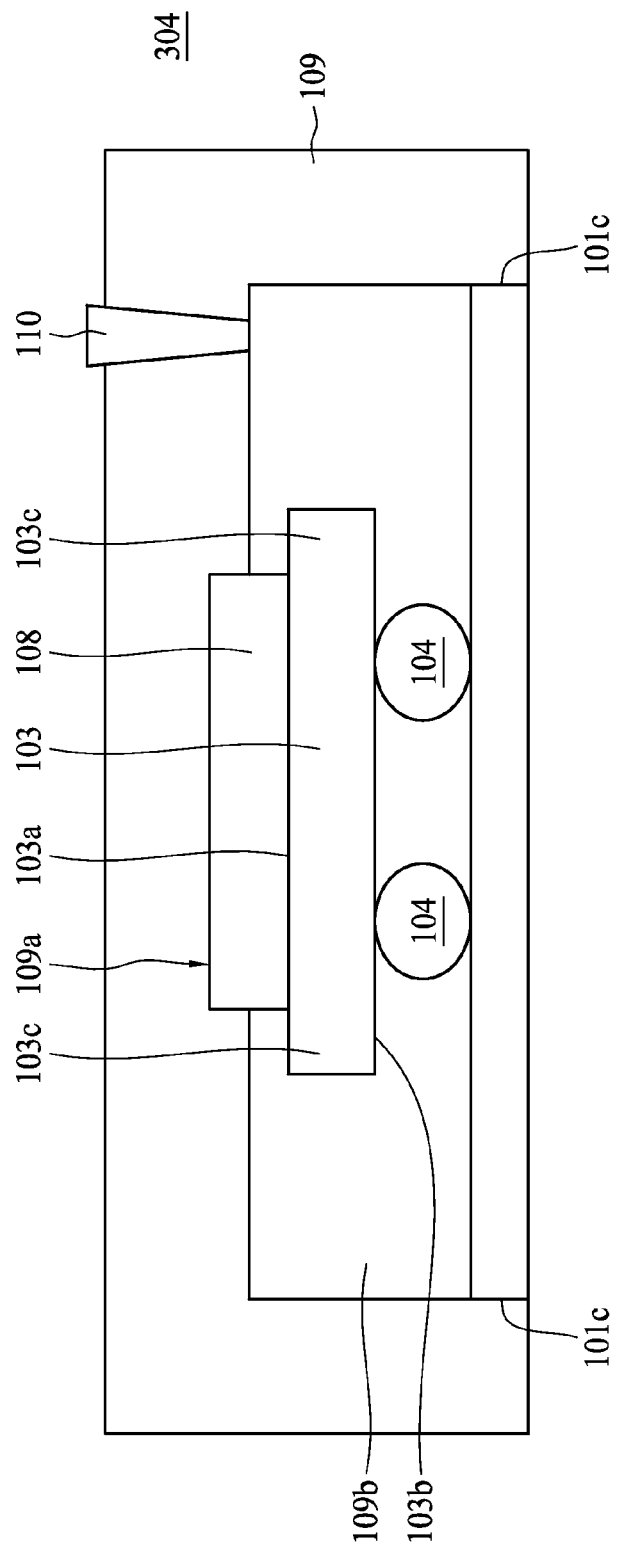
FIG. 3F is a schematic view of an overmold disposed on a rubber material and a carrier in accordance with some embodiments of the present disclosure.

After a deposition of the rubber material 108 on the die 103, the overmold 109 is disposed over the rubber material 108 and the carrier 101 as in FIG. 3F. In some embodiments, the overmold 109 is temporarily attached the sidewall 101c of the carrier 101 upon the overmolding operation and formation of a molding. In some embodiments, the overmold 109 includes a complementary portion 109a which is configured for receiving the rubber material 108. In some embodiments, the overmold 109 includes the chamber 109b for temporarily encapsulating the rubber material 108, the die 103 and the die bumps 104.

Figure 3G:
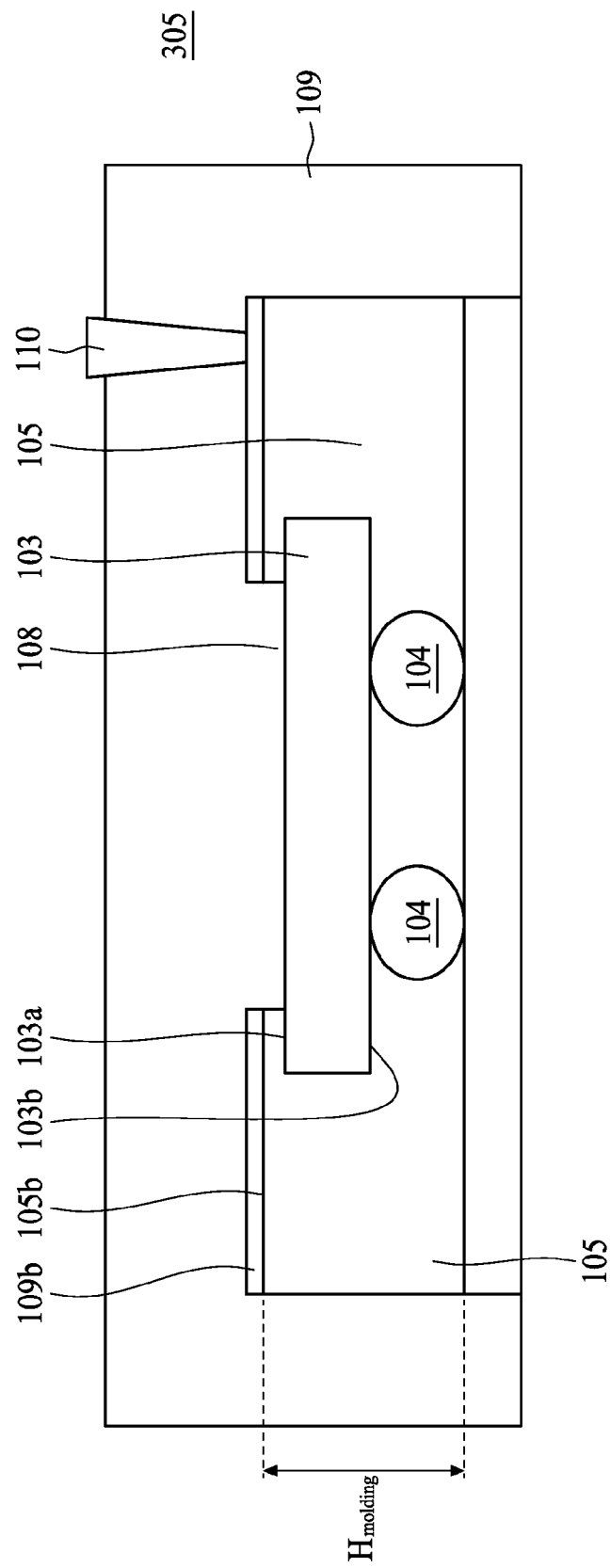
FIG. 3G is a schematic view of a molding formed on a die and a carrier in accordance with some embodiments of the present disclosure.

In operation 305, a molding 105 is disposed between the overmold 109, the die 103 and the carrier 101 as in FIG. 3G. In some embodiments, the molding 105 is flown into the chamber 109b of the overmold 109 and fills the chamber 109b until a predetermined height $H_{molding}$ of the molding 105 is reached. In some embodiments, the molding 105 is flown into the chamber 109b through a passage 110 of the overmold 109. The molding 105 is formed in accordance with a shape of the overmold 109. In some embodiments, a shape of the molding 105 is defined by the chamber 109b of the overmold 109 and the rubber material 108.

In some embodiments, a time for the molding 105 flowing into the chamber 109b and reaching the height $H_{molding}$ of the molding 105 is about 5 seconds to about 30 seconds. In some embodiments, the molding 105 includes a molding compound such as liquid epoxy resin.

Figure 3H:
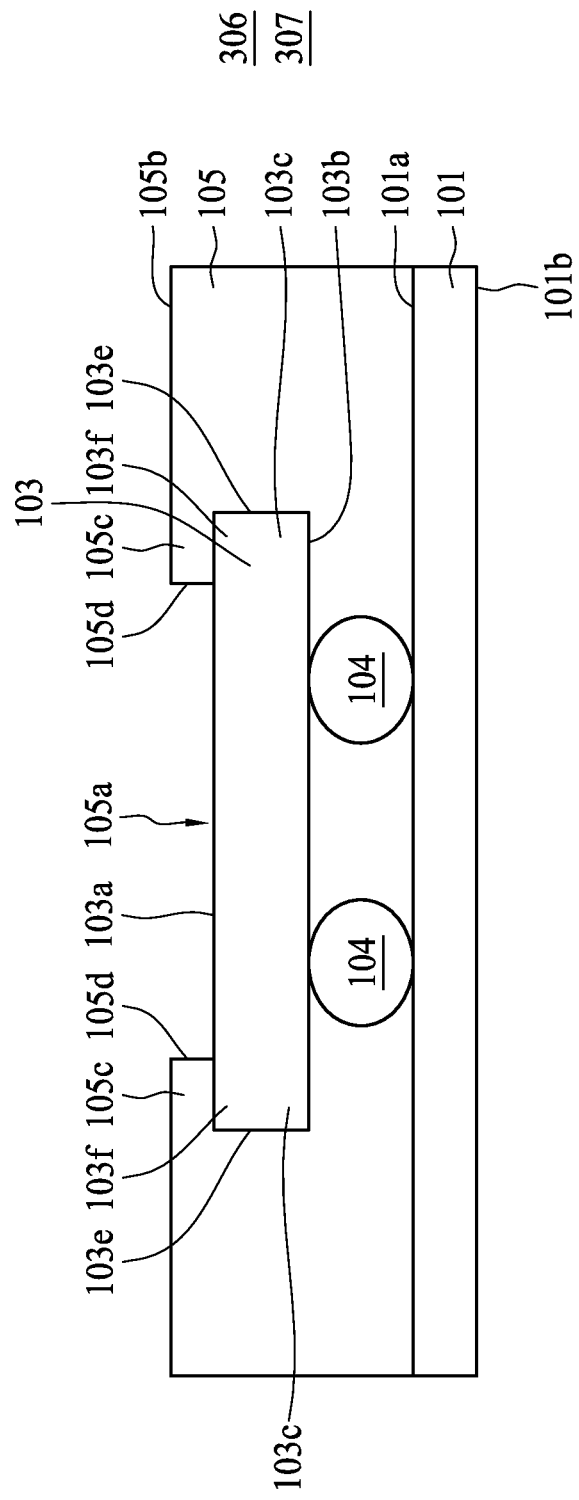
FIG. 3H is a schematic view of a molding formed with a recessed portion on a die in accordance with some embodiments of the present disclosure.

In operation 306, the molding 105 is formed over the carrier 101 as in FIG. 3H. In some embodiments, the molding 105 is formed after a heat treatment such as reflow. In some embodiments, the molding 105 is formed and is extended from the top surface 101a of the carrier 101 to a top surface 105b of the molding 105. In some embodiments, the molding 105 encapsulates the die 103 and the die bumps 104.

In some embodiments, a protruded portion 105c of the molding 105 is formed on a periphery portion 103c of the top surface 103a of the die 103. In some embodiments, the protruded portion 105c is protruded from the sidewall 103e of the die 103 to a sidewall 105d of the protruded portion 105c. In some embodiments, the protruded portion 105c is disposed at the corner 103f of the die 103.

In operation 307, the overmold 109 and the rubber material 108 are removed from the die 103 and the carrier 101 as in FIG. 3H. In some embodiments, the overmold 109 and the rubber material 108 are removed from the top surface 103a of the die 103 by a release film. In some embodiments, the release film is applied on an interface between the overmold 109, the rubber material 108, the molding 105 and the die 103, so that the overmold 109 and the rubber material 108 are releasable and removable from the top surface 103a of the die 103. The overmold 109 and the rubber material 108 is removed after the molding 105 is formed.

In some embodiments, the rubber material 108 defines a recessed portion 105a of the molding above the top surface 103a of the die 103 and within the top surface 103a of the die 103, so that the recessed portion 105a is present on the top surface 103a after a removal of the overmold 109 and the rubber material 108. In some embodiments, the recessed portion 105a is extended from the top surface 105b of the molding 105 to the top surface 103a of the die 103.

In some embodiments, the recessed portion 105a leaves a portion of the top surface 103a uncovered by the molding 105, because the disposition of the rubber material 108 would prevent the molding 105 disposed on the portion of the top surface 103a. Thus, the portion of the top surface 103a is exposed after the molding 105 is formed.

Figure 3I:
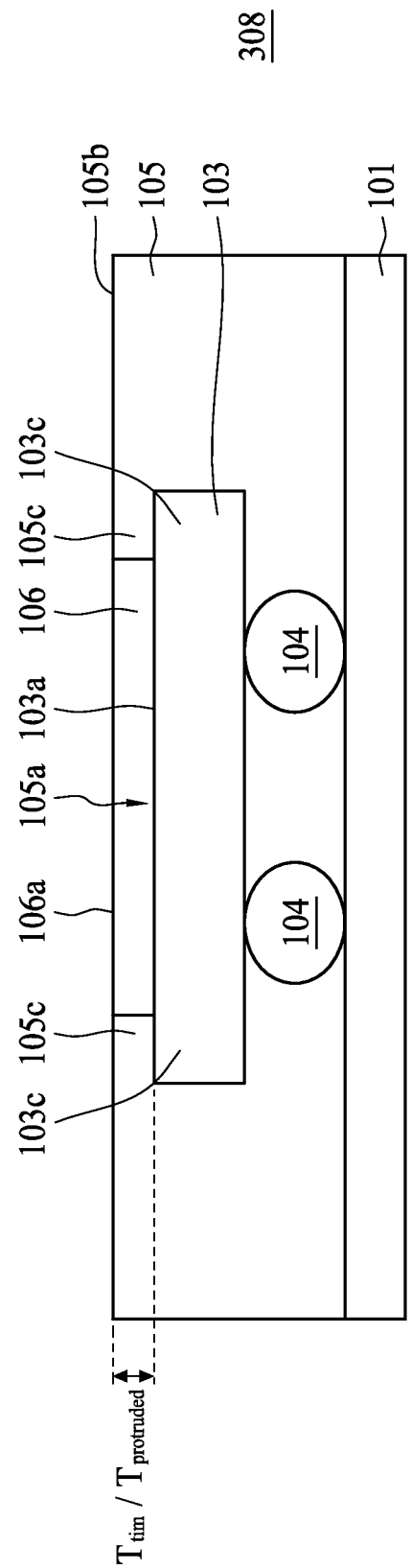
FIG. 3I is a schematic view of a thermal interface material (TIM) disposed on a die in accordance with some embodiments of the present disclosure.

In operation 308, a thermal interface material (TIM) 106 is disposed on the die 103 as in FIG. 3I. In some embodiments, the TIM 106 is disposed on an exposed portion of the top surface 103a of the die 103 and fills the recessed portion 105a. In some embodiments, the TIM 106 is flown into the recessed portion 105a until the TIM 106 reaches a level substantially same as the top surface 105b of the molding 105, so that a top surface 106a of the TIM 106 is at a substantially same level as the top surface 105b.

In some embodiments, the TIM 106 is surrounded by the protruded portion 105c of the molding 105. In some embodiments, the protruded portion 105c secures the TIM 106 within the recessed portion 105a, without flowing out of the recessed portion 105a under a high temperature or during a thermal cycle. In some embodiments, a shape of the TIM 106 is defined by the protruded portion 105c of the molding 105.

In some embodiments, the protruded portion 105c or the TIM 106 defines a bond line thickness (BLT) of the semiconductor package. The BLT is a distance between the top surface 103a of the die 103 and the top surface 105b of the molding 105. In some embodiments, a thickness $T_{tim}$ of the protruded portion 105c or a thickness $T_{protruded}$ of the protruded portion 105c is the BLT of the semiconductor package. As a flowing of the TIM 106 is bounded by the protruded portion 105c of the molding, the BLT of the semiconductor package is under control. Thus, an uniformity of the BLT is provided by disposing the rubber material 108 within the top surface 103a and forming the protruded portion 105c on the periphery portion 103c of the die 103.

Figure 3J:
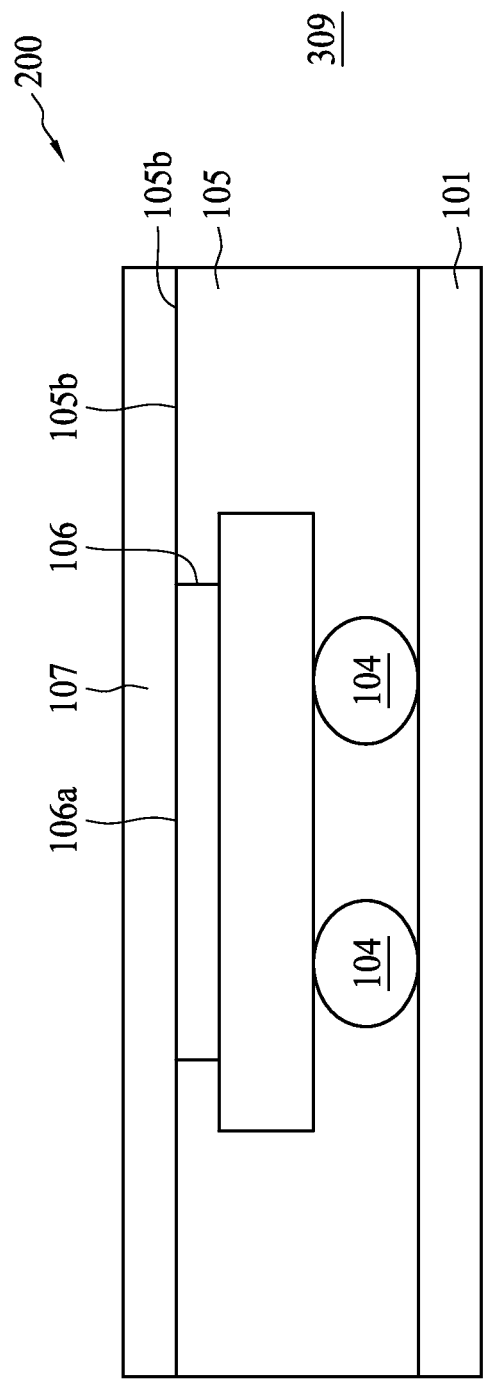
FIG. 3J is a schematic view of a heat dissipator disposed on a molding and a die in accordance with some embodiments of the present disclosure.

In operation 309, a heat dissipator 107 is disposed on the TIM 106 and the molding 105 as in FIG. 3J. In some embodiments, the heat dissipator 107 is disposed on the top surface 105b of the molding 105 and the top surface 106a of the TIM 106, so as to cover the molding 105, the die 103 and the carrier 101 to become a semiconductor package 200.

In some embodiments, the heat dissipator 107 is attached with the TIM 106 and is extended along the top surface 105b of the molding 105 and the top surface 106a of the TIM 106. In some embodiments, the heat dissipator 107 is a heat sink or a heat spreader for transferring a heat generated by the die 103 to the surrounding.

Figure 3K:
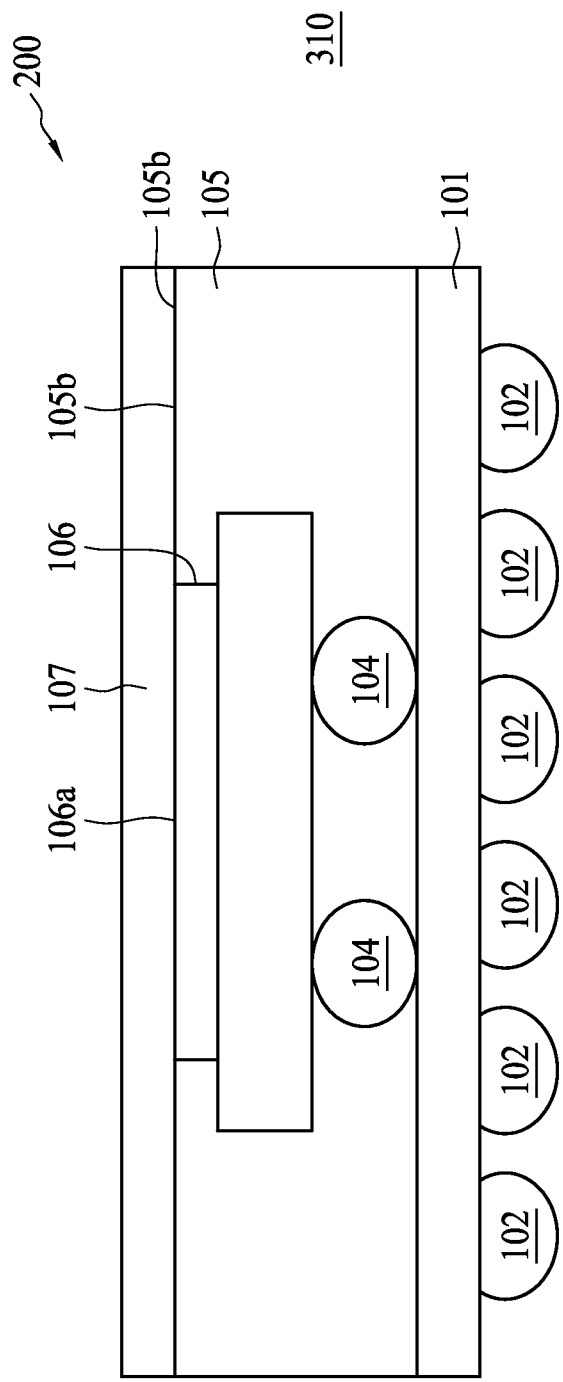
FIG. 3K is a schematic view of a carrier with several second conductive bumps in accordance with some embodiments of the present disclosure.

In operation 310, several conductive bumps 102 are provided and disposed on a bottom surface 101b of the carrier 101 opposite to a top surface 101a as in FIG. 3K. In some embodiments, the conductive bumps 102 are intervally spaced with each other on the bottom surface 101b of the carrier 101. In some embodiments, the conductive bumps 102 are configured for receiving other pads on another carrier and electrically connecting with a circuitry external to the carrier 101.

In some embodiments, each of the conductive bumps 102 is disposed on a bond pad on the bottom surface 101b of the carrier 101, so that each conductive bump 102 is bonded with a corresponding bond pad on the bottom surface 101b. In some embodiments, the conductive bumps 102 are in similar configurations as the conductive bumps 102 in FIGS. 1 and 2.

In some embodiments, a semiconductor device includes a carrier, a die including a first surface and a second surface, a plurality of first conductive bumps disposed between the second surface of the die and the carrier, wherein the die is flip bonded on the carrier, and a molding disposed over the carrier and surrounding the die, the molding includes a recessed portion disposed on the first surface of the die thereby leaving a portion of the first surface uncovered by the molding.

In some embodiments, the first surface of the die is at a level substantially lower than a top surface of the molding. In some embodiments, a sidewall of the recessed portion is distal to a sidewall of the die. In some embodiments, a thermal interface material (TIM) is disposed within the recessed portion of the molding. In some embodiments, the molding interfaced with the first surface of the die is in a staggered configuration. In some embodiments, an interface between the recessed portion and the first surface of the die is in a rectangular quadrilateral or polygonal shape.

In some embodiments, a semiconductor package includes a die including a first surface and a second surface, a carrier including a third surface bonded with a plurality of first conductive bumps on the second surface of the die and a fourth surface disposed with a plurality of second conductive bumps, a molding including a protruded portion disposed on a periphery portion of the first surface and surrounding the plurality of first conductive bumps and the die, a thermal interface material (TIM) disposed on the first surface of the die and surrounded by the protruded portion of the molding, and a heat dissipator attached with the thermal interface material (TIM) and disposed over the molding.

In some embodiments, the protruded portion of the molding is protruded from a sidewall of the die. In some embodiments, the protruded portion of the molding is disposed at a corner of the die. In some embodiments, a top surface of the thermal interface material (TIM) is at a level substantially same as a top surface of the molding.

In some embodiments, a thickness of the protruded portion or a thickness of the thermal interface material (TIM) is substantially equal to a bond line thickness (BLT) of the semiconductor package. In some embodiments, an interface between the protruded portion and the first surface of the die is in a rectangular, quadrilateral or polygonal shape.

In some embodiments, a method of manufacturing a semiconductor device includes providing a carrier, flip bonding a die on the carrier, disposing a rubber material on a first surface of the die and within the first surface of the die, and forming a molding surrounding the rubber material and covering the carrier.

In some embodiments, the disposing the rubber material includes defining a recessed portion of the molding above the first surface of the die and within the first surface of the die. In some embodiments, the method further comprising removing the rubber material by a release film after the molding is formed. In some embodiments, the disposing the rubber material includes defining a bond line thickness (BLT) of the semiconductor device. In some embodiments, the forming the molding includes an overmolding operation.

In some embodiments, the forming the molding includes disposing the molding into a chamber within an overmold. In some embodiments, the forming the molding includes filling a molding underfill between the semiconductor device and an overmold disposed above the semiconductor device. In some embodiments, an interface between the rubber material and the first surface of the die is in a rectangular, quadrilateral or polygonal shape.

The methods and features of this invention have been sufficiently described in the above examples and descriptions. It should be understood that any modifications or changes without departing from the spirit of the invention are intended to be covered in the protection scope of the invention.

Moreover, the scope of the present application in not intended to be limited to the particular embodiments of the process, machine, manufacture, and composition of matter, means, methods and steps described in the specification. As those skilled in the art will readily appreciate from the disclosure of the present disclosure, processes, machines, manufacture, composition of matter, means, methods or steps presently existing or later to be developed, that perform substantially the same function or achieve substantially the same result as the corresponding embodiments described herein maybe utilized according to the present disclosure.

Accordingly, the appended claims are intended to include within their scope such as processes, machines, manufacture, compositions of matter, means, methods or steps. In addition, each claim constitutes a separate embodiment, and the combination of various claims and embodiments are within the scope of the invention.

What is claimed is:

1. A semiconductor device, comprising:
a carrier;
a die including a first surface and a second surface;
a plurality of first conductive bumps disposed between the second surface of the die and the carrier, wherein the die is flip bonded on the carrier; and a molding disposed over the carrier and surrounding the die,
wherein the molding includes a recessed portion disposed on the first surface of the die thereby leaving a portion of the first surface uncovered by the molding, and the recessed portion is configured to receive and restrain a thermal interface material (TIM) to be disposed therein, and an interface between the recessed portion and the first surface is substantially smaller than the first surface.

2. The semiconductor device of claim 1, wherein the first surface of the die is at a level substantially lower than a top surface of the molding.

3. The semiconductor device of claim 1, wherein a sidewall of the recessed portion is distal to a sidewall of the die.

4. The semiconductor device of claim 1, wherein a thermal interface material (TIM) is disposed within the recessed portion of the molding.

5. The semiconductor device of claim 1, wherein the molding interfaced with the first surface of the die is in a staggered configuration.

6. The semiconductor device of claim 1, wherein an interface between the recessed portion and the first surface of the die is in a rectangular, quadrilateral or polygonal shape.

7. A semiconductor package, comprising:
a die including a first surface and a second surface;
a carrier including a third surface bonded with a plurality of first conductive bumps on the second surface of the die and a fourth surface disposed with a plurality of second conductive bumps;
a molding including a protruded portion disposed on a periphery portion of the first surface and surrounding the plurality of first conductive bumps and the die;
a thermal interface material (TIM) disposed on the first surface of the die and restrained by the protruded portion of the molding; and
a heat dissipator attached with the thermal interface material (TIM) and disposed over the molding.

8. The semiconductor package of claim 7, wherein the protruded portion of the molding is protruded from a sidewall of the die.

9. The semiconductor package of claim 7, wherein the protruded portion of the molding is disposed at a corner of the die.

10. The semiconductor package of claim 7, wherein a top surface of the thermal interface material (TIM) is at a level substantially same as a top surface of the molding.

11. The semiconductor package of claim 7, wherein a thickness of the protruded portion or a thickness of the thermal interface material (TIM) is substantially equal to a bond line thickness (BLT) of the semiconductor package.

12. The semiconductor package of claim 7, wherein an interface between the protruded portion and the first surface of the die is in a rectangular, quadrilateral or polygonal shape.

13. A method of manufacturing a semiconductor device, comprising:
providing a carrier;
flip bonding a die on the carrier;
disposing a rubber material on a first surface of the die and within the first surface of the die; and
forming a molding surrounding the rubber material and covering the carrier,
wherein an interface between the rubber material and the first surface is substantially smaller than the first surface, thereby some portions of the molding are disposed on the first surface.

14. The method of claim 13, wherein the disposing the rubber material includes defining a recessed portion of the molding above the first surface of the die and within the first surface of the die.

15. The method of claim 13, further comprising removing the rubber material from the first surface of the die by a release film after the molding is formed.

16. The method of claim 13, wherein the disposing the rubber material includes defining a bond line thickness (BLT) of the semiconductor device.

17. The method of claim 13, wherein the forming the molding includes an overmolding operation.

18. The method of claim 13, wherein the forming the molding includes disposing the molding within a chamber of an overmold.

19. The method of claim 13, wherein the forming the molding includes filling a molding compound between the semiconductor device and an overmold disposed above the semiconductor device.

20. The method of claim 13, wherein the interface between the rubber material and the first surface of the die is in a rectangular, quadrilateral or polygonal shape.

* * * * *